United States Patent [19]
Mase et al.

[11] Patent Number: 5,103,287
[45] Date of Patent: Apr. 7, 1992

[54] MULTI-LAYERED WIRING STRUCTURE OF SEMICONDUCTOR INTEGRATED CIRCUIT DEVICE

[75] Inventors: Yasukazu Mase, Fujisawa; Masahiro Abe, Yokohama; Toshihiko Katsura, Kawasaki, all of Japan

[73] Assignee: Kabushiki Kaisha Toshiba, Kawasaki, Japan

[21] Appl. No.: 605,357

[22] Filed: Oct. 30, 1990

[30] Foreign Application Priority Data

Oct. 31, 1989 [JP] Japan .................................. 1-283942

[51] Int. Cl.$^5$ ............................................. H01L 23/48
[52] U.S. Cl. ..................................... 357/71; 357/68; 361/400; 174/52.1
[58] Field of Search ................... 357/71, 68; 361/400; 174/52

[56] References Cited

U.S. PATENT DOCUMENTS 4,656,732  4/1987  Teng et al. ........................... 357/71

Primary Examiner—Edward J. Wojciechowicz
Attorney, Agent, or Firm—Finnegan, Henderson, Farabow, Garrett, and Dunner

[57] ABSTRACT

An insulation film is formed on a semiconductor substrate in which semiconductor elements are formed. A plurality of wiring layers and interlaid insulation films are alternately laminated on the insulation film. The design margins of the laminated wiring layers and via holes formed in the interlaid insulation films are set to be larger as they are set at a higher level. The design margin is determined by using the focus margin, mask misalignment due to the mask alignment accuracy, pattern size conversion error, warp of the semiconductor substrate and irregularity of the surface of the semiconductor substrate as parameters.

13 Claims, 7 Drawing Sheets

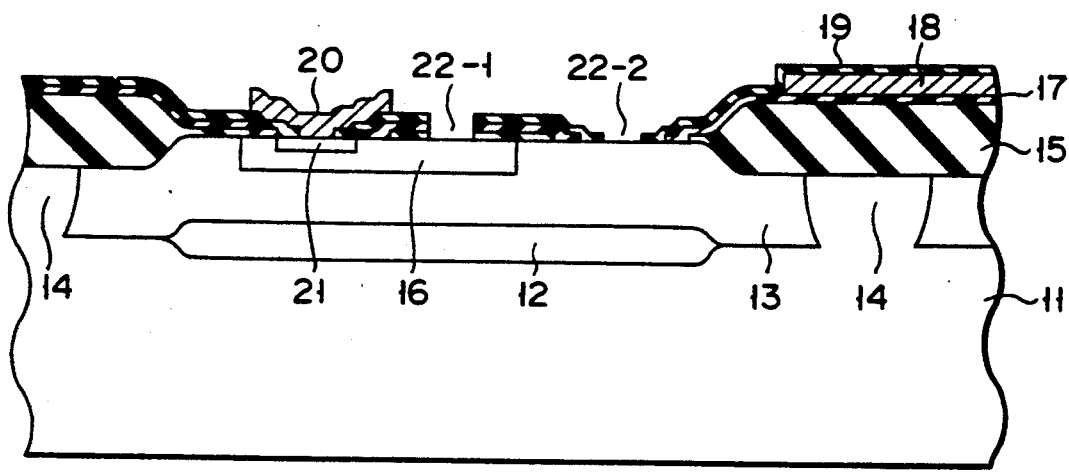
F I G. 1A
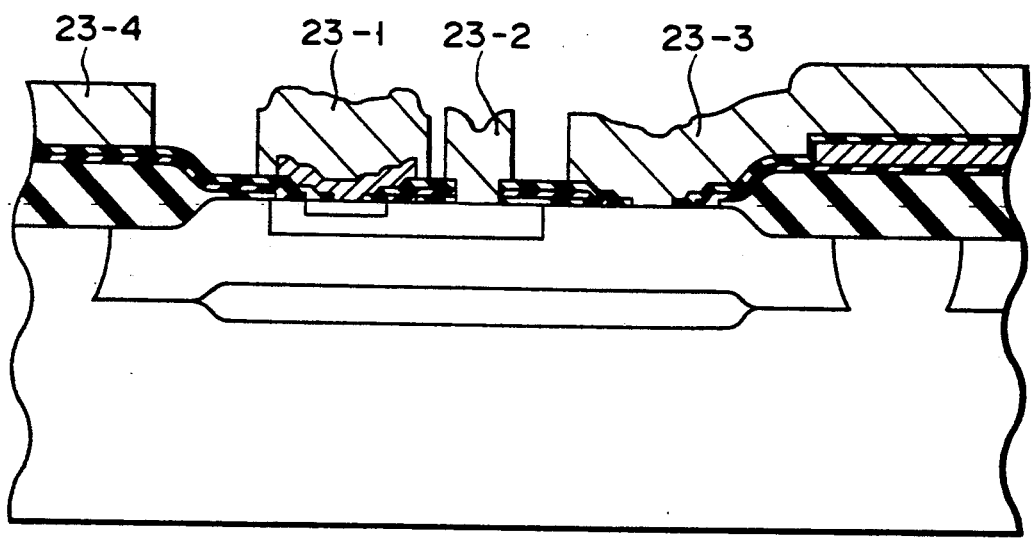
F I G. 1B

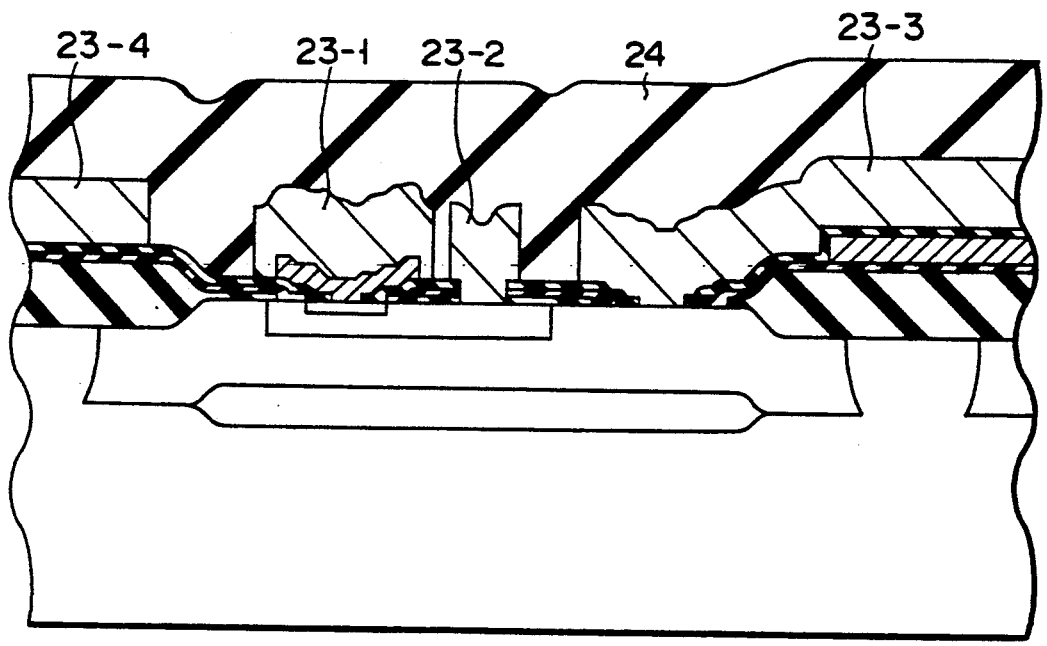
F I G. 1C
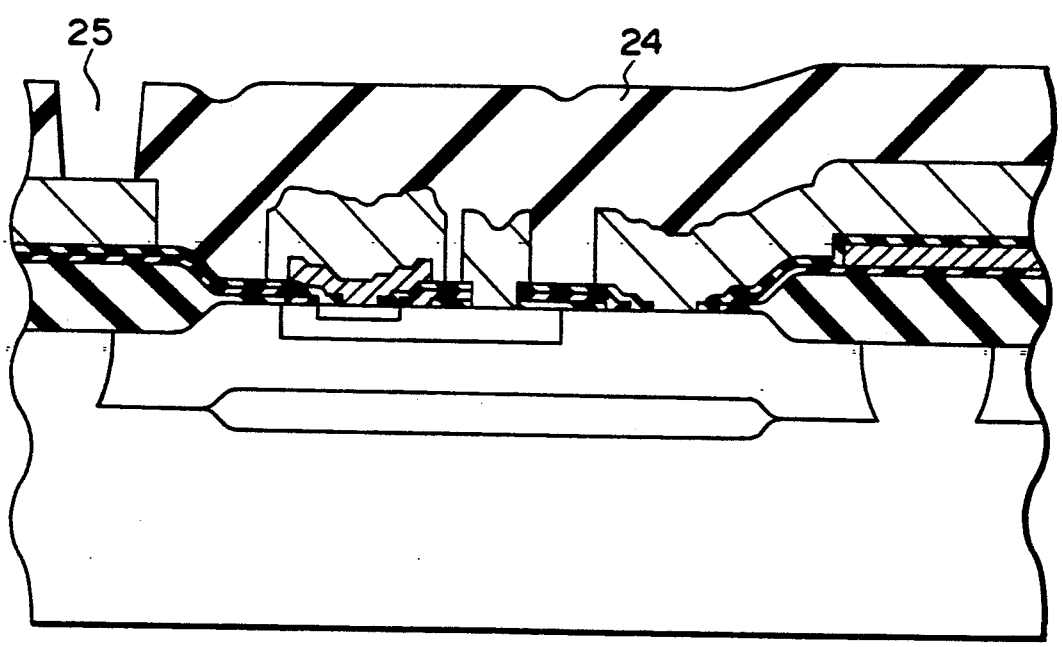
F I G. 1D

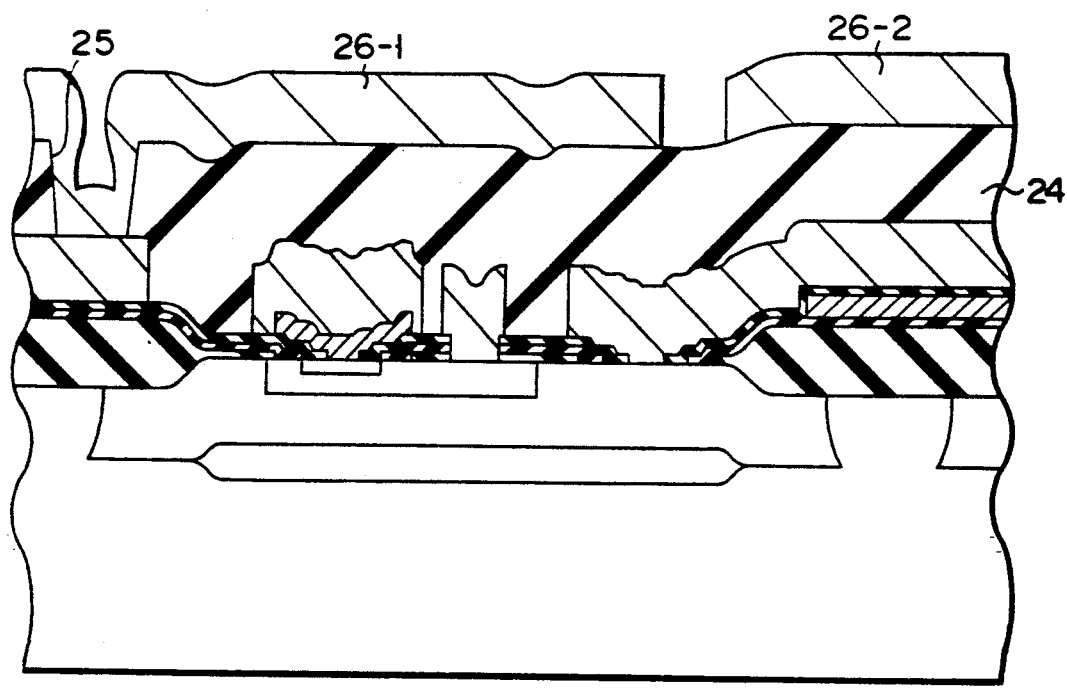
F I G. 1E
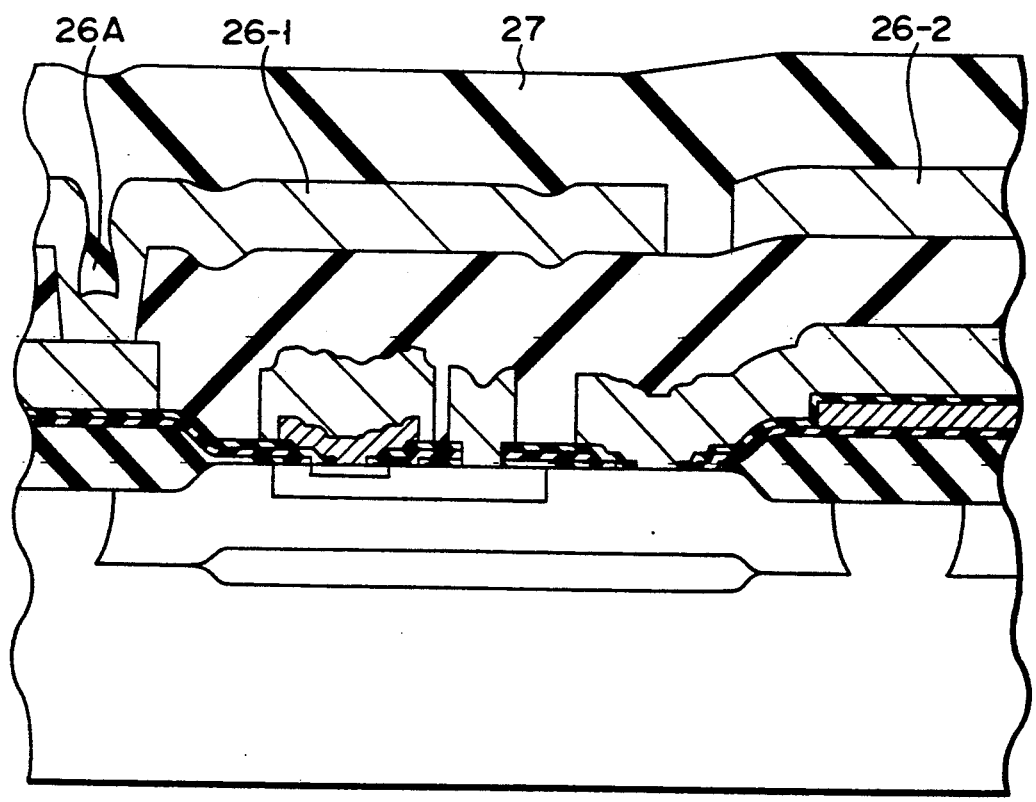
F I G. 1F

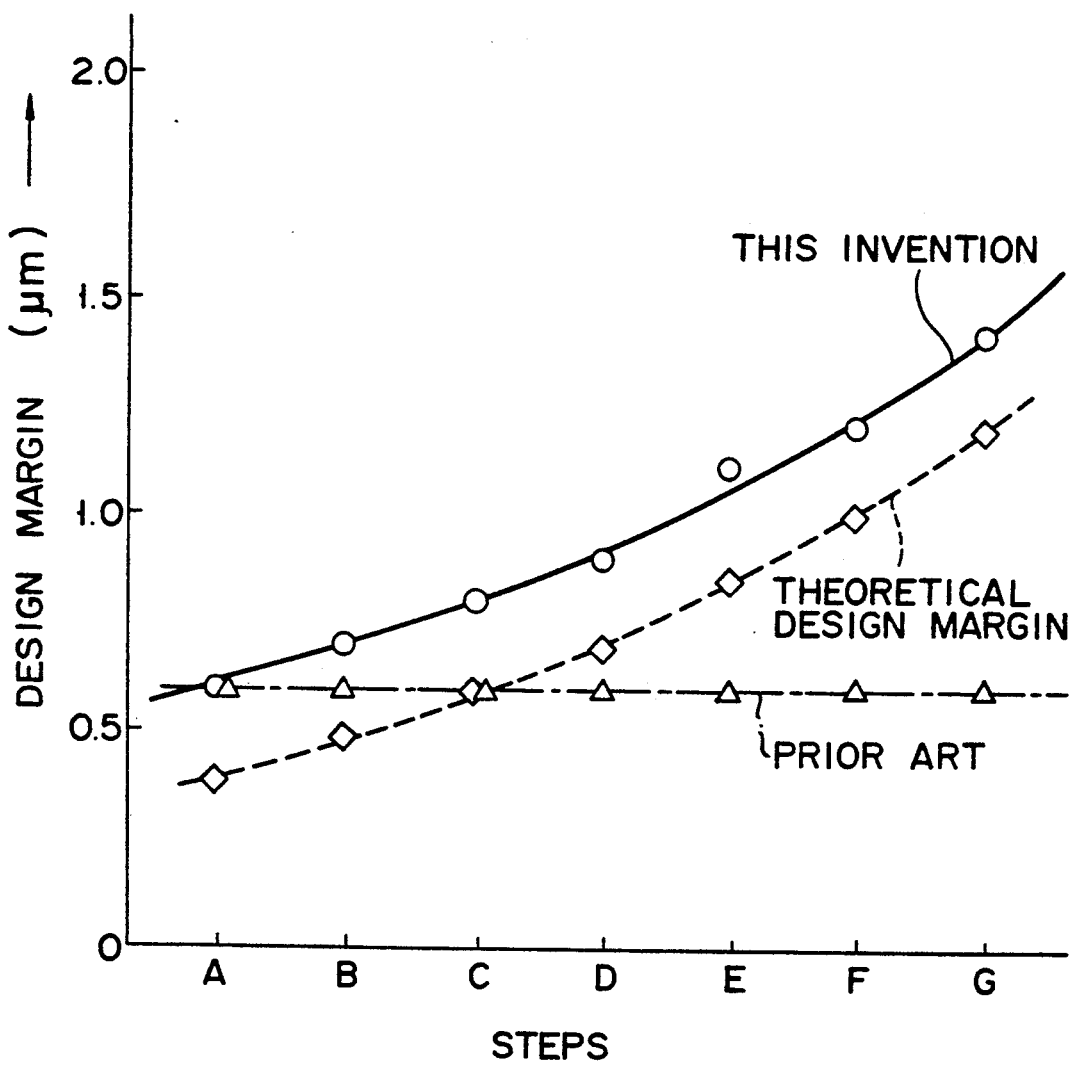
F I G. 2

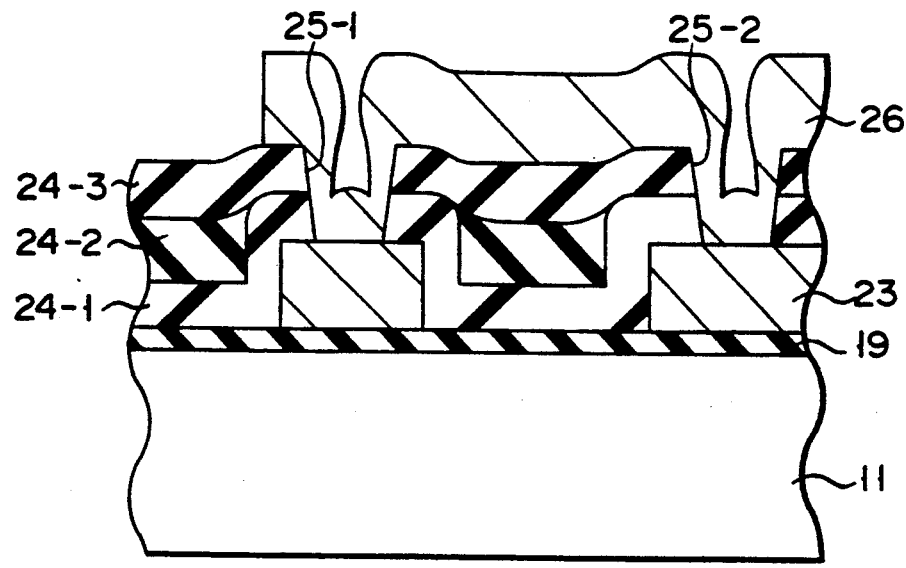
F I G. 3
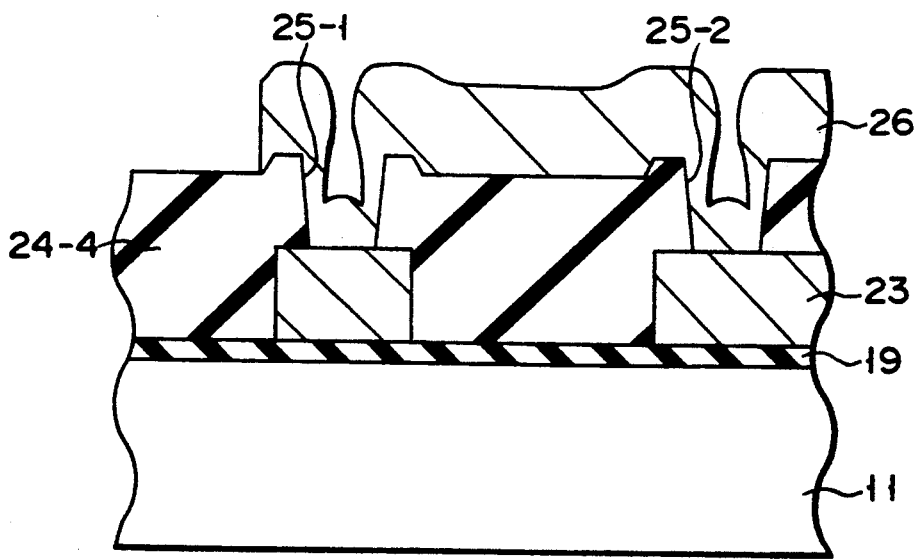
F I G. 4

MULTI-LAYERED WIRING STRUCTURE OF SEMICONDUCTOR INTEGRATED CIRCUIT DEVICE

BACKGROUND OF THE INVENTION

1. Field of the Invention

This invention relates to a multi-layered wiring structure of a semiconductor integrated circuit device, and more particularly to a multi-layered structure preferably used for a device having three or more wiring layers formed therein.

2. Description of the Related Art

In recent years, it has been required to provide the multi-layered structure in large scale integrated circuits as the circuit construction thereof becomes more complicated to attain the high integration density and highly sophisticated functions. Conventionally, with the multi-layered wiring structure, the design margins of via holes formed in an interlaid insulation film between wiring layers and the pattern of the wiring layers are set to a preset value, for example, 0.60 μm. For this reason, abnormal etching may tend to easily occur in the process of patterning the upper layer formed at a higher level because of the presence of stepped portions caused by formation of the lower wiring layer, via holes or the like. For example, in the process of patterning the upper wiring layer, the lower wiring layer lying below the upper wiring layer may be sometimes etched. If such abnormal etching occurs, an increase in the wiring resistance, wiring breakage, electromigration or the like may occur so that the circuit function may be lowered and an operation error may occur, thereby lowering the manufacturing yield and degrading the reliability.

Further, since no special attention is generally paid to the positions of stepped portions of the upper and lower wiring layers in the designing process for the multi-layered wiring structure, the stepped portions of the upper and lower wiring layers may overlap each other. If the stepped portions of the wiring layers overlap each other, the planarization effected by formation of the interlaid insulation film cannot be satisfactorily attained on the overlapped portion and a large stepped portion will be formed in the interlaid insulation film. It is confirmed that the stepped portion caused in the interlaid insulation film becomes larger with an increase in the number of the laminated wiring layers. As a result, the film thickness of a photoresist in the large stepped portion becomes larger and it becomes necessary to increase the amount of exposure with respect to that portion of the interlaid insulation film in which the large stepped portion has been formed when the photolithographic step is effected to form via holes or pattern the wiring layers. Generally, the apparent thickness of the to-be-etched material on the stepped portion is large and the apparent film thickness of the material increases when the stepped portion becomes larger, and therefore, it becomes necessary to increase the etching amount. As a result, the pattern conversion error for the pattern (wiring layer, via holes and the like) of the upper layer formed at a higher level will become larger. In addition, when an over-etching amount increases, the mark for mask alignment and the surface of the field oxide film around the mark become rough and as a result the misalignment and variation in the mask alignment become large. This is because the surface of the plasma SiO film or Si which is the underground of the mask alignment mark which is formed of Al-Si, Al-Si-Cu or the like on the dicing line will be made rough by chlorine-series radicals or the like used in the RIE method, thus making it difficult to effect the precise mask alignment.

Thus, with the conventional multi-layered wiring structure, abnormal etching tends to be more easily caused in the upper wiring layer formed at a higher level by the presence of the stepped portion formed by formation of the lower wiring layer and via holes, and the abnormal etching causes various problems as described above.

SUMMARY OF THE INVENTION

Accordingly, an object of this invention is to provide a semiconductor device having a multi-layered structure in which abnormal etching for the wiring layers and via holes can be reduced.

The object of this invention can be attained by a semiconductor device comprising a semiconductor substrate of a first conductivity type; at least one of active and passive regions of a second conductivity type formed in the main surface area of the semiconductor substrate; an insulation film formed on the semiconductor substrate; a first-level wiring layer formed into a preset pattern with a first design margin on the insulation film; an interlaid insulation film formed on the first-level wiring layer and having at least one via hole and formed into a preset pattern with a second design margin larger than the first design margin; and a second-level wiring layer formed into a preset pattern with a third design margin larger than the second design margin on the interlaid wiring layer.

With the above construction, since the design margins of the laminated wiring layers and via hole are made larger as they are formed at a higher level instead of being set to a preset value as in the prior art, it becomes possible to suppress occurrence of abnormal etching of the wiring layer and via hole. The design margin may be determined according to the focus margin, mask misalignment due to the mask alignment accuracy, pattern size conversion error, warp of the semiconductor substrate and irregularity of the surface of the semiconductor substrate used as parameters. According to the above method, various problems due to abnormal etching can be prevented even in the multi-layered wiring structure having three or more layers when the same multi-layer wiring process as in the prior art is effected. As a result, occurrence of an increase in the wiring resistance, wiring breakage, short-circuit, electromigration or the like can be prevented so that reduction in the circuit function and occurrence of an operation error may be prevented, thereby making it possible to manufacture a highly reliable semiconductor device at a high manufacturing yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1H are cross sectional views showing the manufacturing process of a semiconductor device having a multi-layered wiring structure according to a first embodiment of this invention in the order of the manufacturing steps;

FIG. 2 is a diagram showing the relation between the design margin indicated on the ordinate and the respective steps indicated on the abscissa so as to compare the conventional case and the case of this invention;

FIG. 3 is a cross sectional view showing an example of the construction of an interlaid insulation film formed between first-level and second-level wiring layers, for illustrating a semiconductor device according to a second embodiment of this invention;

FIG. 4 is a cross sectional view showing another example of the construction of an interlaid insulation film formed between first-level and second-level wiring layers, for illustrating a semiconductor device according to a third embodiment of this invention.

DETAILED DESCRIPTION OF THE PREFERRED EMBODIMENTS

Figure 1G:
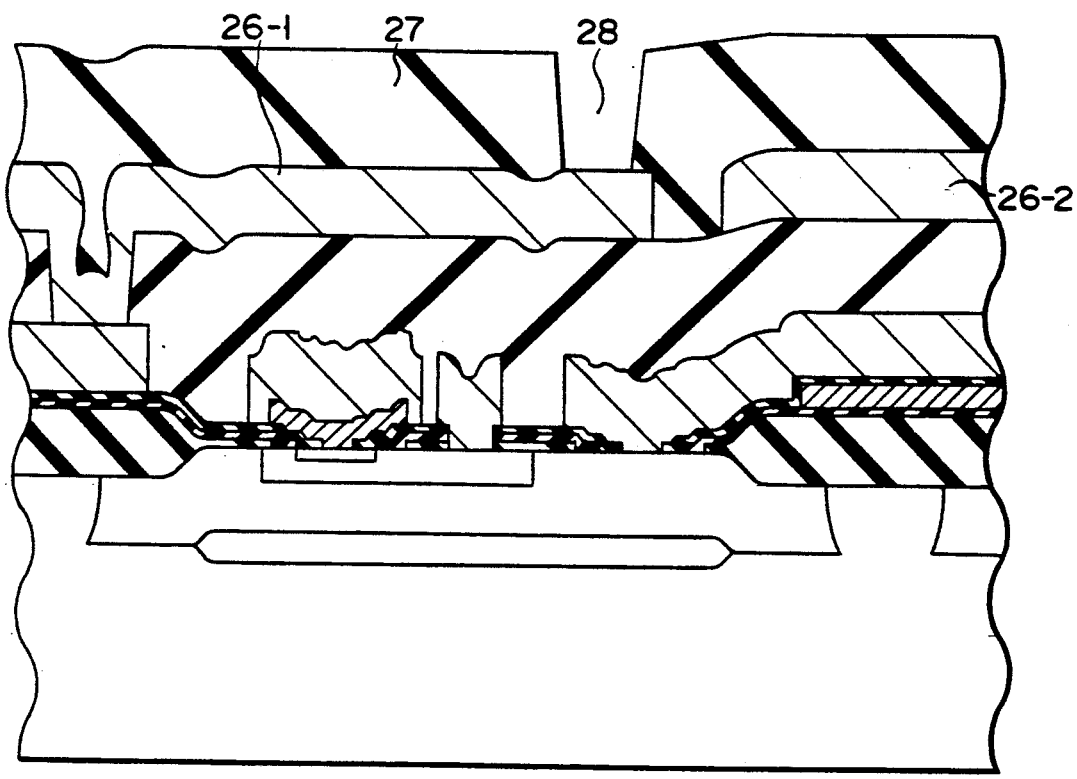

FIGS. 1A to 1H show the manufacturing process of a semiconductor device having a multi-layered wiring structure according to a first embodiment of this invention in the order of the manufacturing steps, and in this embodiment, a bipolar transistor is used as an example of the semiconductor device. As shown in FIG. 1A, an N+-type impurity diffusion region (buried layer) 12 is formed in the surface area of a P-type silicon substrate (semiconductor substrate) 11. An N-type epitaxial layer 13 is formed on the substrate 11. At the time of formation of the epitaxial layer 13, N-type impurity is diffused from the impurity diffusion region 12 in upward and downward directions (that is, into the epitaxial layer 13 and the substrate 11, respectively) to form an N+-type buried layer 12 near the junction plane between the epitaxial layer 13 and the substrate 11. A P+-type isolation region 14 is formed in the epitaxial layer 13 to reach the substrate 11, thus isolating a bipolar transistor forming area from the remaining portion. An element isolation field oxide film 15 is selectively formed on the resultant structure. A P-type impurity diffusion region 16 acting as a base region is formed in the surface area of that portion of the epitaxial layer 13 (acting as a collector region) which is isolated by the isolation region 14. A first CVD-SiO$_2$ film 17 is formed on the exposed surface of the field oxide film 15 and substrate 11. A resistance layer 18 formed of a polysilicon layer is formed on part of the field insulation film 15 which lies on the CVD-SiO$_2$ film 17. A second CVD-SiO$_2$ film 19 is formed on the resultant structure. An opening is formed in that part of the CVD-SiO$_2$ film 19 which lies over the impurity diffusion region 16 and a polysilicon layer 20 having N-type impurity doped therein is formed on the CVD-SiO$_2$. N-type impurity is doped into the surface area of the impurity diffusion region 16 with the polysilicon layer 20 used as an impurity source so as to form an N+-type impurity diffusion region 21 acting as an emitter region. Contact holes 22-1 and 22-2 are formed in the SiO$_2$ films 17 and 19 which are formed on parts of the impurity diffusion region 16 and epitaxial layer 13.

Next, as shown in FIG. 1B, an Al-Si layer (an Al layer or another Al alloy layer may be used) is formed to a thickness of 1.0 μm on the resultant structure by the sputtering method and then the Al-Si layer is patterned by use of the photolithography method and RIE method. At this time, since the Al-Si layer has a portion whose film thickness is increased by the presence of the stepped portion of the lower layer, etching of more than the thicknesses (1 μm) of the Al-Si layer, that is, over-etching is effected. As a result, a first-level wiring layer 22 used for an emitter electrode 23-1, base electrode 23-2, collector electrode 23-3 and a peripheral wiring layer 23-4 is formed.

Then, as shown in FIG. 1C, a first-level interlaid insulation film 24 formed of plasma SiO is formed to a thickness of 1.5 μm on the resultant structure by the plasma CVD method and resist etch-back method.

A resist pattern (not shown) is formed on that portion of the first level interlaid insulation film 24 which lies on the wiring layer 23-4 by the photolithography method and then etching is effected by use of the RIE method using fluorine-series gas such as C$_2$F$_6$, CHF$_3$ or SF$_6$ to form a first via hole 25 as shown in FIG. 1D. Also, in this case, over-etching for the thickness larger than the thickness of the interlaid insulation film 24 is effected in the same manner as in the process of pattering the first-level wiring layer 23. The design margin between the pattern of the first-level wiring layer 23 and the pattern of the first via hole 25 is approx. 0.6 μm.

Then, second-level wiring layers 26-1 and 26-2 shown in FIG. 1E are formed on the thus formed interlaid insulation film 24 formed in the same manner as is used for formation of the wiring layer 22. That is, an Al-Si layer (an Al layer or another Al alloy layer may be used) of a thickness of 1.0 μm is first formed on the interlaid insulation film 24 and then the Al-Si layer is selectively removed and patterned by the RIE method to form second-level wiring layers 26-1 and 26-2. The design margin between the pattern of the first via hole 25 and the pattern of the second-level wiring layers 26-1 and 26-2 is approx. 0.7 μm.

Next, a second-level interlaid insulation film 27 formed of plasma SiO having a thickness of 1.5 μm is formed by the plasma CVD method and resist etch-back method (refer to FIG. 1F). Further, as shown in FIG. 1G, a second via hole 28 is formed by use of the RIE method. At this time, in order to prevent defective etching due to the presence of the stepped portion, over-etching for a thickness larger than the thickness of the interlaid insulation film 27 is effected. The design margin between the patterns of the second-level wiring layers 26-1 and 26-2 and the pattern of the second via hole 28 is approx. 0.8 μm.

Figure 1H:
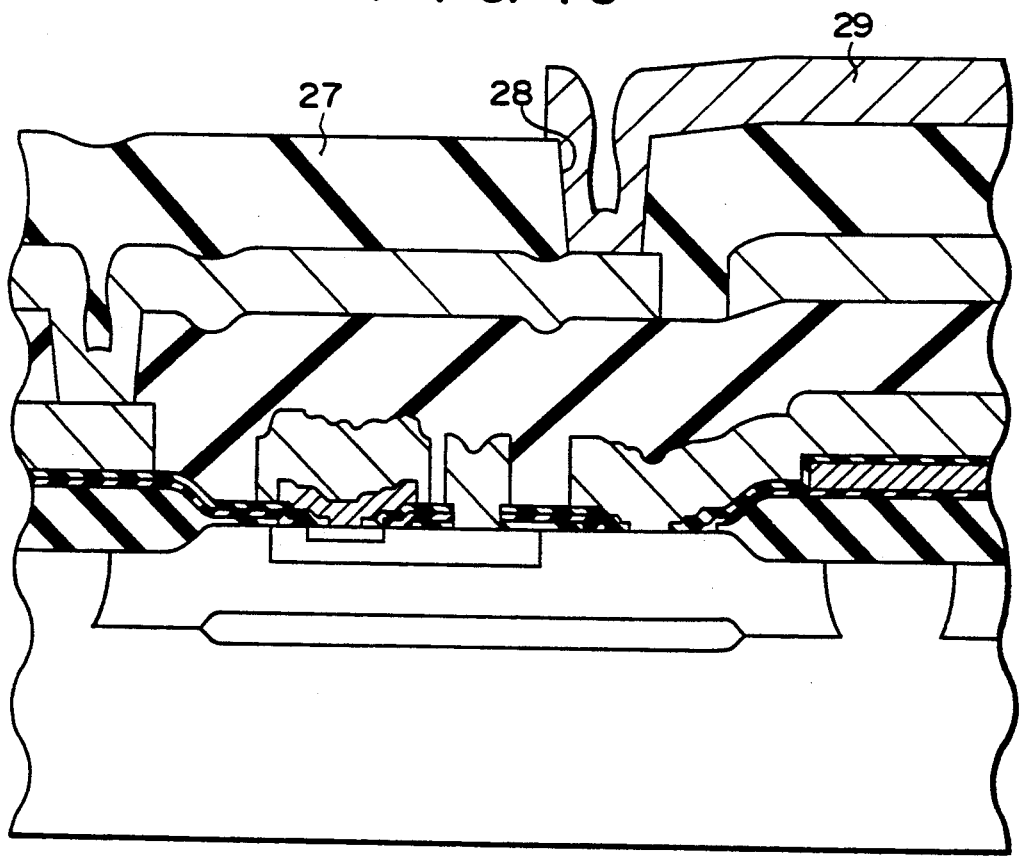

Then, as shown in FIG. 1H, a third-level wiring layer 29 is formed. That is, an Al-Si layer (an Al layer or another Al alloy layer may be used) is formed to a thickness of 1.0 μm on the second-level interlaid insulation film 27 by the sputtering method. The Al-Si layer is patterned by use of the RIE method to form a third-level wiring layer 29. At the time of etching the Al-Si layer, over-etching for more than the thicknesses of the Al-Si layer is effected. The design margin between the pattern of the second via hole 28 and the pattern of the third-level wiring layer 29 is 1.0 to 1.1 μm.

Although not shown in the drawing, insulation films such as a passivation film, bonding pad and the like are formed on the semiconductor structure shown in FIG. 1H. The passivation layer is formed after the highest-level wiring layer (the third-level wiring layer 29 in FIG. 1H) is formed, and it is formed of a single layered or multi-layered silicon nitride film, PSG (phosphor Silicate Glass) film, plasma SiO film or the like. Openings are formed in the passivation layer by use of the RIE method and bonding pads which are connected to respective wiring layers via the openings are formed on the passivation layer. The design margin between the pattern of the highest-level wiring layer and the pattern of the openings and the design margin between the pattern of the openings and the pattern of the bonding pads are respectively set larger than the above-described design margins.

FIG. 2 shows the relation between the design margin ($\mu$m) indicated on the ordinate and the respective steps (A to G) indicated on the abscissa. In FIG. 2, the design margins in the respective manufacturing step obtained in the case of using a four-layered wiring layer are shown. The design margin is a maximum permissible error. In the case of mask misalignment, for example, a misalignment of 0.3 $\mu$m is permitted on both sides of a pattern formed when the design margin is 0.6 $\mu$m. A dot-dash line indicates the design margin in the conventional case, a solid line indicates the design margin in the case of this invention, and broken lines indicate the theoretical design margin. The step A is a step of patterning the first-level wiring layer and forming the first via hole, the step B is a step of forming the first via hole and patterning the second-level wiring layer, the step C is a step of patterning the second-level wiring layer and forming the second via hole, the step D is a step of forming the second via hole and patterning the third-level wiring layer, the step E is a step of patterning the third-level wiring layer and forming the third via hole in the third-level interlaid insulation film, the step F is a step of forming the third via hole and patterning the fourth-level wiring layer, and the step G is a step of forming the the fourth-level wiring layer and bonding pad.

As shown in the drawing, in the conventional multi-layered structure, the design margins in the steps A to G are all set to the same value, that is, 0.6 $\mu$m. In contrast, in this invention, the design margin for the wiring layer and via hole formed in the higher level is set larger and is set to be larger than the corresponding theoretical value.

With the multi-layered structure formed according to this invention, since the design margins of the wiring layer and the like formed at a higher level are set larger with the mask alignment accuracy, pattern size conversion error, margin, warp of the semiconductor substrate and irregularity of the surface of the semiconductor substrate used as parameters, it becomes possible to suppress occurrence of abnormal etching of the wiring layer and via hole. As a result, abnormal etching of the wiring layer formed of Al or Al alloy in the via hole can be prevented and the step coverage in the via hole can be improved. Therefore, the following effects (1) to (4) can be attained.

(1) Since abnormal etching of the wiring layer formed of Al or Al alloy in the via hole can be prevented, various defects caused by the stepped portion of the via hole can be eliminated, thereby enhancing the yield by 4 to 7%.

(2) Since reduction in the conduction path in the via hole caused by abnormal etching does not occur, the electromigration resistance can be enhanced so that occurrence of the electromigration can be suppressed and the lifetime of the device can be extended by approx. 20%.

(3) Since it is possible to cope with the surface irregularity which becomes larger when the wiring layer and via hole are formed at a higher level, it is not necessary to previously effect the mask alignment and etching, thereby enhancing the throughput.

(4) Since the same multi-layered wiring process as in the prior art can be used and it can be performed simply by changing the pattern design, it is not necessary to develop a novel process, and the cost for the manufacturing process is the same as that of the conventional case so that the total cost can be reduced according to the improvement of the yield and throughput.

In the above embodiment, an example in which the bipolar transistor is used as the semiconductor device formed in the semiconductor substrate is explained, but this invention is not limited to this example. This invention can be applied to any semiconductor device or semiconductor integrated circuit in which a multi-layered structure is formed on the substrate thereof. In the above embodiment, the multi-layered structure having a three-layered wiring layer is explained as an example, but substantially the same effect can be attained for a multi-layered structure having a two- or more-layered wiring layer. Further, the method of forming the multi-layered wiring structure and the material of the wiring layer and interlaid insulation film are not limited to those described in the above embodiment. Also, the numerical values of the design margins of the wiring layer and via hole are not limited to those indicated in FIG. 2 and may be set to optimum values according to the multi-layered structure, manufacturing process, and the materials and film thicknesses of the wiring layer and interlaid insulation film. In this case, it is of course necessary to set the design margin larger for the wiring layers or the like disposed at a higher level. Further, the design margins of the wiring layer and via hole disposed at a higher level are set larger but only one of the design margins of the wiring layer and via hole disposed at a higher level ma be set larger.

In the structure shown in FIG. 1F, the second-level wiring layer 26-1 is formed in the first via hole 25 and the second-level interlaid insulation film 27 is buried in a small recess 26A formed in the wiring layer 26-1, but it is possible to selectively bury an On Aluminum Passivation layer into the recess. In addition, the effect can be further enhanced by applying various planarization techniques as shown in FIGS. 3 to 5 to the interlaid insulation films 24 and 27.

FIG. 3 is a cross sectional view showing another example of the construction of the interlaid insulation film disposed between the first-level wiring layer and the second-level wiring layer, for illustrating a second embodiment of this invention. In this case, much stress is put on the first-level wiring layer, first-level interlaid insulation film and second-level wiring layer and the corresponding portions are distinctly shown. That is, the interlaid insulation film 24 is formed to have a three-layered structure, and a first-level wiring layer 23 is formed into a preset pattern and then a first-level CVD-SiO$_2$ film 24-1 is formed on the resultant structure. After this, an SOG film 24-2 is formed on the CVD-SiO$_2$ film 24-1 and then the SOG film 24-2 is etched back to be partly partly left behind in the recessed portion of the SiO$_2$ film 24-1. Next, a second-level CVD-SiO$_2$ film 24-3 is formed on the SiO$_2$ film 24-1 and the remaining SOG film 24-2. Then, a second-level wiring layer 26 is formed on the CVD-SiO$_2$ film 24-3. The second-level wiring layer 26 is connected to the first-level wiring layer 23 via the via holes 25-1 and 25-2 if necessary.

FIG. 4 shows still another example of the construction of the interlaid insulation film, for illustrating a third embodiment of this invention. The interlaid insulation film 24-4 is made flat by the bias sputtering method.

Figure 5:
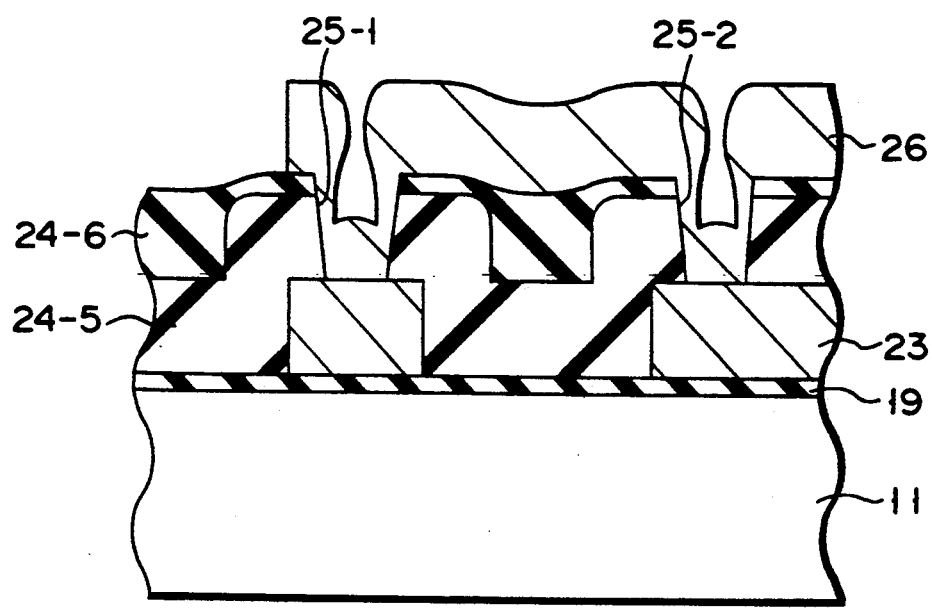
FIG. 5 is a cross sectional view showing still another example of the construction of an interlaid insulation film formed between first-level and second-level wiring layers, for illustrating a semiconductor device according to a fourth embodiment of this invention.

FIG. 5 shows another example of the construction of the interlaid insulation film, for illustrating a fourth embodiment of this invention. In this embodiment, the interlaid insulation film 24 is formed of a CVD-SiO$_2$ film 24-5 and a polyimide film 24-6. After the first-level wiring layer 23 is formed into a preset pattern, the CVD-SiO$_2$ film 24-5 is formed on the resultant structure and then the polyimide film 24-6 is formed on the CVD-SiO$_2$ film 24-5 to make the surface thereof flat. Next, a second-level wiring layer 26 is formed on the polyimide film 24-6, and the second-level wiring layer 26 is connected to the first wiring layer 23 via the via holes 25-1 and 25-2, as required.

In FIGS. 3 to 5, the first-level interlaid insulation film 24 is explained, but a second- or higher-level interlaid insulation film can be formed with substantially the same construction.

What is claimed is:

1. A semiconductor device comprising:
    a semiconductor substrate of a first conductivity type;
    at least one of active and passive regions of a second conductivity type formed in a main surface area of said semiconductor substrate;
    an insulation film formed on said semiconductor substrate;
    a first-level wiring layer formed into a preset pattern with a first design margin on said insulation film;
    an interlaid insulation film formed on said first-level wiring layer and having at least one via hole which is formed into a preset pattern with a second design margin larger than said first design margin;
    a second-level wiring layer formed into a preset pattern with a third design margin larger than said second design margin on said interlaid insulation film, said second-level wiring layer having a width greater than that of said first-level wiring level; and
    each of said first to third design margins is determined by using, as a parameter, at least one of a mask alignment accurracy, a pattern size conversion error, a warp of said semiconductor substrate, a mask misalignment due to an irregularity of a surface of said semiconductor, and a focus margin.

2. A semiconductor device according to claim 1, wherein said first-level wiring layer is electrically connected to said second-level wiring layer via said via hole.

3. A semiconductor device according to claim 1, wherein said interlaid insulation film includes an SiO$_2$ film formed on said insulation film and first-level wiring layer by plasma CVD method and resist each-back method.

4. A semiconductor device according to claim 1, wherein said interlaid insulation film is formed of a first CVD-SiO$_2$ film formed on said insulation film and first-level wiring layer; an SOG film formed on said first CVD-SiO$_2$ film and etched back to be partly left behind in a recessed portion of said first CVD-SiO$_2$ film; and a second CVD-SiO$_2$ film formed on said first CVD-SiO$_2$ film and SOG film.

5. A semiconductor device according to claim 1, wherein said interlaid insulation film includes an SiO$_2$ film formed on said insulation film and first-level wiring layer by the bias sputtering method.

6. A semiconductor device according to claim 1, wherein said interlaid insulation film includes a CVD-SiO$_2$ film formed on said insulation film and first-level wiring layer and a polyimide film formed on said CVD-SiO$_2$ film.

7. A multi-layered wiring structure of a semiconductor integrated circuit device comprising:
    a first-level wiring layer formed into a preset pattern with a first design margin on an insulation film;
    a first-level interlaid insulation film having at least one first via hole and formed into a preset pattern with a second design margin larger than said first design margin on said first-level wiring layer;
    a second-level wiring layer formed into a preset pattern with a third design margin larger than said second design margin on said first-level interlaid insulation film, said second-level wiring layer having a width greater than that of said first-level wiring layer;
    a second-level interlaid insulation film having at least one second via hole and formed into a preset pattern with a fourth design margin larger than said third design margin on said second-level wiring layer, said second via hole being larger in said size than said first via hole;
    a third-level wiring layer formed into a preset pattern with a fifth design margin larger than said fourth design margin on said second-level interlaid insulation film, said third-level wiring layer having a width greater than that of said second-level wiring layer; and
    each of said first to fifth design margins is determined by using, as a parameter, at least one of a mask alignment accuracy, a pattern size conversion error, a warp of said semiconductor substrate, a mask misalignment due to an irregularity of a surface of said semiconductor, and a focus margin.

8. A multi-layered wiring structure according to claim 7, wherein said first-level wiring layer is electrically connected to said second-level wiring layer via said first via hole formed in said first-level interlaid insulation film.

9. A multi-layered wiring structure according to claim 7, wherein said second-level wiring layer is electrically connected to said third-level wiring layer via said second via hole formed in said second-level interlaid insulation film.

10. A multi-layered wiring structure according to claim 7, wherein at least one of said first- and second-level interlaid insulation films includes an SiO$_2$ film formed by plasma CVD method and resist each-back method.

11. A multi-layered wiring structure according to claim 7, wherein at least one of said first- and second-level interlaid insulation films is formed of a first CVD-SiO$_2$ film; an SOG film formed on said first CVD-SiO$_2$ film and etched back to partly remain in a recessed portion of said first CVD-SiO$_2$ film; and a second CVD-SiO$_2$ film formed on said first CVD-SiO$_2$ film and SOG film.

12. A multi-layered wiring structure according to claim 8, wherein at least one of said first- and second-level interlaid insulation films includes a $SiO_2$ film formed by the bias sputtering method.

13. A multi-layered wiring structure according to claim 7, wherein at least one of said first- and second-level interlaid insulation films includes a $CVD\text{-}SiO_2$ film; and a polyimide film formed on said $CVD\text{-}SiO_2$ film.

* * * * *

UNITED STATES PATENT AND TRADEMARK OFFICE
CERTIFICATE OF CORRECTION

PATENT NO. : 5,103,287
DATED : April 07, 1992
INVENTOR(S) : Yasukazu Mase et al It is certified that error appears in the above-identified patent and that said Letters Patent is hereby corrected as shown below:

Claim 1, column 7, line 50, change "accurracy" to --accuracy--.

Claim 3, column 7, line 61, change "each-back" to --etch-back--.

Claim 7, column 8, line 30, before "size" delete "said".

Claim 7, column 8, line 40, change "accurracy" to --accuracy--.

Claim 10, column 8, line 57, change "each-back" to --etch-back--.

UNITED STATES PATENT AND TRADEMARK OFFICE
CERTIFICATE OF CORRECTION

PATENT NO. : 5,103,287
DATED : April 07, 1992
INVENTOR(S) : Yasukazu Mase et al

It is certified that error appears in the above-indentified patent and that said Letters Patent is hereby corrected as shown below:

Claim 12, column 8, line 68, change "claim 8" to --claim 7--.

Signed and Sealed this

Second Day of November, 1993

Attest:

BRUCE LEHMAN

Attesting Officer

Commissioner of Patents and Trademarks